(12) United States Patent  
Plants et al.

(10) Patent No.: US 6,980,028 B1  
(45) Date of Patent: **\*Dec. 27, 2005**

(54) DEDICATED INPUT/OUTPUT FIRST IN/FIRST OUT MODULE FOR A FIELD PROGRAMMABLE GATE ARRAY

(75) Inventors: William C. Plants, Sunnyvale, CA (US); Arunangshu Kundu, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/056,983

(22) Filed: Feb. 11, 2005

Related U.S. Application Data

(63) Continuation of application No. 10/452,764, filed on May 30, 2003, now Pat. No. 6,867,615.

(51) Int. Cl.[7] .......................... H03K 19/177; G06F 7/38
(52) U.S. Cl. ............................. 326/40; 326/41; 326/47
(58) Field of Search ............................. 326/38, 39, 40, 326/41, 47

(56) References Cited

U.S. PATENT DOCUMENTS

| | | | |
|---|---|---|---|
| 4,255,748 A | 3/1981 | Bartlett | 340/661 |
| 4,625,313 A | 11/1986 | Springer | 371/20 |
| 4,638,187 A | 1/1987 | Boler et al. | 307/451 |
| 4,638,243 A | 1/1987 | Chan | 324/51 |
| 4,684,830 A | 8/1987 | Tsui et al. | 307/465 |
| 4,700,130 A | 10/1987 | Bloemen | 324/110 |
| 4,706,216 A | 11/1987 | Carter | 365/94 |
| 4,713,557 A | 12/1987 | Carter | 307/242 |
| 4,717,912 A | 1/1988 | Harvey et al. | 340/825.83 |
| 4,718,042 A | 1/1988 | Moll et al. | 365/201 |
| 4,742,252 A | 5/1988 | Agrawal | 307/465 |
| 4,772,812 A | 9/1988 | Desmarais | 307/473 |
| 4,800,176 A | 1/1989 | Kakumu et al. | 437/193 |
| 4,857,774 A | 8/1989 | El-Ayat et al. | 307/465 |
| 4,870,300 A | 9/1989 | Nakaya et al. | 307/303 |
| 4,870,302 A | 9/1989 | Freeman | 307/465 |
| 4,873,459 A | 10/1989 | El Gamal et al. | 307/465 |
| 4,928,023 A | 5/1990 | Marshall | 307/443 |
| 4,930,097 A | 5/1990 | Ledenbach et al. | 364/716 |
| 4,935,645 A | 6/1990 | Lee | 307/362 |
| 4,959,561 A | 9/1990 | McDermott et al. | 307/443 |
| 4,978,905 A | 12/1990 | Hoff et al. | 323/314 |
| 5,008,855 A | 4/1991 | Eltoukhy et al. | 365/96 |
| 5,046,035 A | 9/1991 | Jigour et al. | 364/716 |
| 5,083,083 A | 1/1992 | El Ayat et al. | 324/158 R |
| 5,121,394 A | 6/1992 | Russell | 371/72.1 |
| 5,122,685 A | 6/1992 | Chan et al. | 307/465.1 |
| 5,126,282 A | 6/1992 | Chiang et al. | 437/172 |

(Continued)

FOREIGN PATENT DOCUMENTS

EP    0 415 542 A2    3/1991    ........ H03K 19/173

(Continued)

OTHER PUBLICATIONS

L. Ashby, "ASIC Clock Distribution using a Phase Locked Loop (PLL)", *Proceedings Fourth Annual IEEE International ASIC Conference and Exhibit*, pp. 6.1-6.3, Sep. 1991.

(Continued)

*Primary Examiner*—Daniel Chang  
(74) *Attorney, Agent, or Firm*—Sierra Patent Group, Ltd.

(57) ABSTRACT

A field programmable gate array having a plurality of input/output pads and dedicated input/output first-in/first-out memory. The dedicated input/output first-in/first-out memory comprising a plurality of input/output clusters coupled to the input/output pads of the field programmable gate array and a plurality of input/output block controllers coupled to said input/output clusters.

1 Claim, 11 Drawing Sheets

U.S. PATENT DOCUMENTS

| | | | |
|---|---|---|---|
| 5,132,571 A | 7/1992 | McCollum et al. | 307/465.1 |
| 5,144,166 A | 9/1992 | Camarota et al. | 307/465.1 |
| 5,187,392 A | 2/1993 | Allen | 307/465 |
| 5,198,705 A | 3/1993 | Galbraith et al. | 307/465 |
| 5,208,491 A | 5/1993 | Ebeling et al. | 307/465 |
| 5,220,213 A | 6/1993 | Chan et al. | 307/465 |
| 5,220,215 A | 6/1993 | Douglas et al. | 307/465 |
| 5,221,865 A | 6/1993 | Phillips et al. | 307/465 |
| 5,222,066 A | 6/1993 | Grula et al. | 371/21.1 |
| 5,258,319 A | 11/1993 | Inuishi et al. | 437/35 |
| 5,272,388 A | 12/1993 | Bakker | 307/202.1 |
| 5,286,992 A | 2/1994 | Ahrens | 257/356 |
| 5,293,133 A | 3/1994 | Birkner et al. | 324/713 |
| 5,300,830 A | 4/1994 | Hawes | 307/465 |
| 5,300,832 A | 4/1994 | Rogers | 307/475 |
| 5,317,698 A | 5/1994 | Chan | 395/325 |
| 5,365,485 A | 11/1994 | Ward et al. | 365/221 |
| 5,367,207 A | 11/1994 | Goetting et al. | 307/465 |
| 5,375,089 A | 12/1994 | Lo | 365/189.04 |
| 5,394,033 A | 2/1995 | Tsui et al. | 326/41 |
| 5,394,034 A | 2/1995 | Becker et al. | 326/39 |
| 5,396,128 A | 3/1995 | Dunning et al. | 326/68 |
| 5,397,939 A | 3/1995 | Gordon et al. | 326/38 |
| 5,399,920 A | 3/1995 | Van Tran | 356/83 |
| 5,400,262 A | 3/1995 | Mohsen | 364/489 |
| 5,430,335 A | 7/1995 | Tanoi | 327/170 |
| 5,430,687 A | 7/1995 | Hung et al. | 365/230.08 |
| 5,469,003 A | 11/1995 | Kean | 326/39 |
| 5,469,396 A | 11/1995 | Eltoukhy | 365/210 |
| 5,473,268 A | 12/1995 | Declercq et al. | 326/80 |
| 5,485,103 A | 1/1996 | Pedersen et al. | 326/41 |
| 5,486,775 A | 1/1996 | Veenstra | 126/38 |
| 5,526,312 A | 6/1996 | Eltoukhy | 365/201 |
| 5,537,057 A | 7/1996 | Leong et al. | 326/41 |
| 5,546,019 A | 8/1996 | Liao | 326/81 |
| 5,559,464 A | 9/1996 | Orii et al. | 327/333 |
| 5,572,148 A * | 11/1996 | Lytle et al. | 326/41 |
| 5,572,476 A | 11/1996 | Eltoukhy | 365/210 |
| 5,666,322 A | 9/1997 | Conkle | 365/233 |
| 5,670,905 A | 9/1997 | Keeth et al. | 327/333 |
| 5,744,979 A | 4/1998 | Goetting | 326/39 |
| 5,744,980 A | 4/1998 | McGowan et al. | 326/40 |
| 5,801,547 A | 9/1998 | Kean | 326/40 |
| 5,809,281 A | 9/1998 | Steele et al. | 395/497.1 |
| 5,815,003 A | 9/1998 | Pedersen | 326/39 |
| 5,815,004 A | 9/1998 | Trimberger et al. | 326/41 |
| 5,821,776 A | 10/1998 | McGowan | 326/41 |
| 5,825,200 A | 10/1998 | Kolze | 326/38 |
| 5,825,201 A | 10/1998 | Kolze | 326/39 |
| 5,825,202 A | 10/1998 | Tavana et al. | 326/39 |
| 5,825,662 A | 10/1998 | Trimberger | 364/491 |
| 5,828,230 A | 10/1998 | Young | 326/41 |
| 5,828,538 A | 10/1998 | Apland et al. | 361/56 |
| 5,831,448 A | 11/1998 | Kean | 326/41 |
| 5,832,892 A | 11/1998 | Yaoita | 123/260 |
| 5,835,165 A | 11/1998 | Keate et al. | 348/845.1 |
| 5,835,998 A | 11/1998 | Pedersen | 326/40 |
| 5,838,167 A | 11/1998 | Erickson et al. | 326/38 |
| 5,838,584 A | 11/1998 | Kazarian | 364/491 |
| 5,838,954 A | 11/1998 | Trimberger | 395/500 |
| 5,847,441 A | 12/1998 | Cutter et al. | 257/530 |
| 5,847,577 A | 12/1998 | Trimberger | 326/38 |
| 5,848,005 A | 12/1998 | Cliff et al. | 365/230.03 |
| 5,848,006 A | 12/1998 | Nagata | 365/230.06 |
| 5,850,151 A * | 12/1998 | Cliff et al. | 326/39 |
| 5,850,152 A | 12/1998 | Cliff et al. | 326/40 |
| 5,850,564 A | 12/1998 | Ting et al. | 395/800.37 |
| 5,852,608 A | 12/1998 | Csoppenszky et al. | 370/465 |
| 5,854,763 A | 12/1998 | Gillingham et al. | 365/189.04 |
| 5,859,542 A | 1/1999 | Pedersen | 326/39 |
| 5,859,543 A | 1/1999 | Kolze | 326/41 |
| 5,859,544 A | 1/1999 | Norman | 326/40 |
| 5,861,761 A | 1/1999 | Kean | 326/41 |
| 5,869,981 A | 2/1999 | Agrawal et al. | 326/39 |
| 5,870,586 A | 2/1999 | Baxter | 395/500 |
| 5,880,492 A | 3/1999 | Duong et al. | 257/209 |
| 5,880,512 A | 3/1999 | Gordon et al. | 257/530 |
| 5,880,597 A | 3/1999 | Lee | 326/41 |
| 5,880,598 A | 3/1999 | Duong | 326/41 |
| 5,883,526 A | 3/1999 | Reddy et al. | 326/41 |
| 5,883,850 A | 3/1999 | Lee et al. | 365/230.03 |
| 5,949,719 A | 9/1999 | Clinton et al. | 365/189.01 |
| 5,952,847 A | 9/1999 | Plants et al. | 326/80 |
| 5,994,934 A | 11/1999 | Yoshimura et al. | 327/158 |
| 6,011,744 A | 1/2000 | Sample et al. | 365/230.03 |
| 6,034,677 A | 3/2000 | Noguchi et al. | 345/327 |
| 6,038,627 A | 3/2000 | Plants | 710/126 |
| 6,049,487 A | 4/2000 | Plants et al. | 365/189.04 |
| 6,107,826 A | 8/2000 | Young et al. | 326/41 |
| 6,111,448 A | 8/2000 | Shibayama | 327/293 |
| 6,181,174 B1 | 1/2001 | Fujieda et al. | 327/159 |
| 6,289,068 B1 | 9/2001 | Hassoun et al. | 375/376 |
| 6,292,016 B1 | 9/2001 | Jefferson et al. | 326/39 |
| 6,326,812 B1 | 12/2001 | Jefferson | 326/93 |
| 6,329,839 B1 | 12/2001 | Pani et al. | 326/41 |
| 6,430,088 B1 | 8/2002 | Plants et al. | 365/189.04 |
| 6,437,650 B1 | 8/2002 | Sung et al. | 331/25 |
| 6,496,887 B1 | 12/2002 | Plants | 710/100 |

FOREIGN PATENT DOCUMENTS

| | | | | |
|---|---|---|---|---|
| EP | 0 415 542 A3 | 10/1991 | | H03K 19/173 |
| EP | 0 889 593 A1 | 1/1999 | | H03K 19/173 |
| EP | 1 137 188 A2 | 9/2001 | | H03L 7/08 |

OTHER PUBLICATIONS

"AV9170 Clock Synchronizer and Multiplier", pp. 1-4, Nov. 8, 1992.

"AV9170 Application Note", AvaSem, pp. 1-7, Jan. 1993.

U. Ko, "A 30-ps JITTER, 3.6-μs Locking, 3.3-Volt digital PLL for CMOS Gate Arrays", *IEEE 1993 Custom Integrated Circuits Conference*, pp. 23.3.1-23.3.4, Conf. Date: May 9-12, 1993.

A Efendovich et al., "Multi-Frequency Zero-Jitter Delay-Locked Loop", *IEEE 1993 Custom Integrated Circuits Conference*, pp. 27.1.1-27.1.4, Conf. Date: May 9-12, 1993.

R. Quinnell, "Blending gate arrays with dedicated circuits sweetens ASIC development", EDN, pp. 29-32, Mar. 31, 1994.

J. Chen, "PLL-based clock systems span the system spectrum from green PCs to Alpha", EDN, pp. 147-148, 150, 152, 154-155, Nov. 9, 1995.

P. Sevalia, "Straightforward techniques cut jitter in PLL-based clock drivers", EDN, pp. 119-123, 125, Nov. 23, 1995.

D. Bursky, "Memories Hit New Highs and Clocks Run Jitter-Free", Electronic Design, pp. 79-80, 84-85, 89-93, Feb. 19, 1996.

"Introduction to Actel FPGA Architecture", Actel Corp. Application Note, pp. 5-1-5-8, Sep. 1997.

"XC4000E and XC4000X Series Field Programmable Gate Arrays", Xilinx Corp. Product Specification (Version 1.6), pp. 6-5-6-72, May 14, 1999.

"Virtex™-E 1.8 V Field Programmable Gate Arrays", Xilinx Corp. Production Product Specification, Module 1, DS022-1 (v2.3) pp. 1-6, Module 2, DS022-2 (v2.4) pp. 1-52, Module 3 DS022-3 (v2.8) pp. 1-25, and Module 4, DS022-4 (v2.4) pp. 1-147, Jul. 17, 2002.

"APEX 20K Programmable Logic Device", Altera Corp. DS-APEX20K-5.1 Data Sheet, pp. 1-117, Mar. 2004.

* cited by examiner

DEDICATED INPUT/OUTPUT FIRST IN/FIRST OUT MODULE FOR A FIELD PROGRAMMABLE GATE ARRAY

CROSS-REFERENCE TO RELATED APPLICATIONS

This application is a continuation of U.S. patent application Ser. No. 10/452,764, filed May 30, 2003, now U.S. Pat. No. 6,867,615.

BACKGROUND OF THE SYSTEM

1. Field of the System

The present system relates to field programmable gate array (FPGA) devices. More specifically, the system relates to a input/output first in/first out module for an FPGA.

2. Background

FPGAs are known in the art. An FPGA comprises any number of logic modules, an interconnect routing architecture and programmable elements that may be programmed to selectively interconnect the logic modules to one another and to define the functions of the logic modules. To implement a particular circuit function, the circuit is mapped into the array and the appropriate programmable elements are programmed to implement the necessary wiring connections that form the user circuit.

An FPGA core tile may be employed as a stand-alone FPGA, repeated in a rectangular array of core tiles, or included with other functions in a system-on-a-chip (SOC). The core FPGA tile may include an array of logic modules, and input/output modules. An FPGA circuit may also include other components such as random access memory (RAM) modules. Horizontal and vertical routing channels provide interconnections between the various components within an FPGA core tile. Programmable connections are provided by programmable elements between the routing resources.

An FPGA circuit can be programmed to implement virtually any set of digital functions. Input signals are processed by the programmed circuit to produce the desired set of outputs. Such inputs flow from the user's system, through input buffers and through the circuit, and finally back out the user's system via output buffers referred to as input/output ports (I/Os). Such buffers provide any or all of the following input/output (I/O) functions: voltage gain, current gain, level translation, delay, signal isolation or hysteresis.

The input/output ports provide the access points for communication between chips. I/O ports vary in complexity depending on the FPGA. FIG. 1 is a simplified schematic diagram illustrating a basic I/O circuit structure 10 as well known to those of ordinary skill in the art. I/O circuit structure 10 comprises an output buffer 12, an input buffer 14 and an I/O pad 16. Output buffer 12 receives signals from the FPGA core via output signal line 20. When the output buffer is enabled by a control signal sent through the output enable control line 18, output buffer 12 provides a signal to I/O pad 16 via output signal line 22. Input buffer 14 provides a signal to the FPGA core via input signal line 24 when the input buffer is enabled by a control signal sent through the input enable control line 26. Input buffer 14 receives a signal from I/O pad 16 through input line 28.

FIG. 2 is a simplified schematic diagram illustrating an I/O circuit structure 30 having registers. I/O circuit structure 30 comprises an I/O pad 32 coupled to output buffer 34 coupled to the FPGA core (not shown) through register 36. I/O pad 32 is also coupled to the FPGA core through input buffer 38 and register 40. Output buffer 34 receives signals from the FPGA core through register 36 via signal line 42 when register is enabled and provides the output signal to I/O pad 32 via signal line 48. Input buffer 38 receives signals from I/O pad 32 via signal line 50 and provides signals to the FPGA core through register 40 via input signal line 52.

As set forth above, FPGAs are programmable digital logic chips. A board level digital system is comprised of a printed circuit board with several digital chips interconnected to perform a digital function. Complex system level tasks are realized by smaller tasks that are carried out by specialized dedicated chips. The chips are then connected together to provide the overall system function.

The communication between the components of a system can be described by the signaling and the data format. The device's input/output (I/O) ports provide the signaling format. For example, the signaling format may be 3.3V PCI, low voltage transistor transistor logic (LVTTL) or low voltage differential signaling (LVDS). The data format for communication between chips is system dependent. Some of the system dependent parameters include the bus width and the clocking scheme. For example, data can be transmitted bit-wise serially or n-bits in parallel. Also, the clocking of the transmitters and receivers can be synchronous or otherwise. First-in/first-out memories (FIFO) are often used in systems to bridge data flow gaps between chips. Data flow gaps are the result of chips working with different clock rates, different clock skew, different data bus widths or readiness differences of two chips to send or read packets of data.

A FIFO is basically a SRAM memory with automatic read and write address generation and some additional control logic. Counters are used for address generation. The data sequence read from a FIFO memory is the same as the data sequence written to its memory. The sequencing of the write and read addresses is controlled by the control logic.

Circuits implementing a FIFO function are often used for transmitting and recovering data. In these applications, data can be received until the FIFO memory has become full, often indicated by a FIFO-full flag. Data can also be read from the FIFO until the memory has become empty often indicated by a FIFO-empty flag. Read and write operations need not be synchronized to each other.

FIFOs are suited for applications requiring frequency and phase coupling. The FIFO provides the means to pass data between one clock domain and the next. The write clock and the read clock need not be locked in frequency or phase to pass data between the clock domains. One example is a transmitter sending data at 66 Mbits/second serially and the receiver processing data in bursts at 132 Mbits/second. The receiver FIFO would have its write clock operating at 66 Mhz and the read clock at 132 Mhz. Handshake signals are required to prevent data from being lost at either the full or empty states of the FIFO. The empty and full flags provide such handshake control. Some applications have the write clock and the read clock at the same frequency, but the clocks are not locked in phase. The FIFO provides the means to pass data from one clock domain to the next.

FIFOs are also well suited for applications requiring data bus width matching. An example would be when data into the chip is wider that data inside the chip. Another example is when the data bus width internal to the FPGA is wider than the data bus width in the off chip direction.

An FPGA is capable of implementing a FIFO function. However, the implementation would require programming all of the FIFO components, the address counters, flag logic and memory into the FPGA's core logic. The implementation would consume a considerable number of logic modules and the performance would be dependent on the FPGA architecture.

Hence, there is a need for an FPGA that has dedicated logic specifically included to implement a input/output FIFO function. There is also a need for an FPGA that has dedicated logic to implement the FIFO control and flag logic. Ideally, the input/output FIFO logic would be included among the logic components in an FPGA core tile. Hence, what is needed is an FPGA having dedicated logic to implement a FIFO function. The result is improved performance and a decrease in silicon area needed to implement the FIFO functions due to the small silicon area needed to implement the FIFO function with dedicated logic.

SUMMARY OF THE SYSTEM

The system comprises a field programmable gate array that has a plurality of input/output pads and at least one dedicated input/output first-in/first-out memory. The dedicated input/output first-in/first-out memory comprises at least one of input/output clusters coupled to the input/output pads of the field programmable gate array and at least one of input/output block controllers coupled to said input/output clusters.

A better understanding of the features and advantages of the present invention will be obtained by reference to the following detailed description of the invention and accompanying drawings, which set forth an illustrative embodiment in which the principles of the invention are utilized.

DETAILED DESCRIPTION OF THE DRAWINGS

Those of ordinary skill in the art will realize that the following description of the present invention is illustrative only and not in any way limiting. Other embodiments of the invention will readily suggest themselves to such skilled persons.

In the present disclosure, Vcc is used to define the positive power supply for the digital circuit as designed. As one of ordinary skill in the art will readily recognize, the size of a digital circuit may vary greatly depending on a user's particular circuit requirements. Thus, Vcc may change depending on the size of the circuit elements used.

Moreover, in this disclosure, various circuits and logical functions are described. It is to be understood that designations such as "1" and or "0" in these descriptions are arbitrary logical designations. In a first implementation of the invention, or "1" may correspond to a voltage high, while "0" corresponds to a voltage low or ground, while in a second implementation, "0" may correspond to a voltage high, while "1" corresponds to a voltage low or ground. Likewise, where signals are described, a "signal" as used in this disclosure may represent the application, or pulling "high" of a voltage to a node in a circuit where there was low or no voltage before, or it may represent the termination, or the bringing "low" of a voltage to the node, depending on the particular implementation of the invention.

Figure 1:
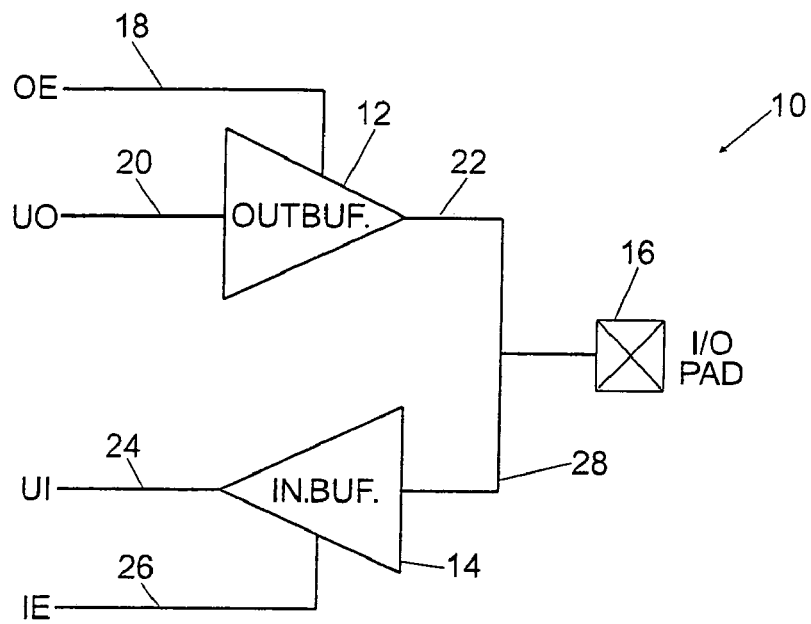
FIG. 1 is a simplified schematic drawing showing an input/output port.
Figure 2:
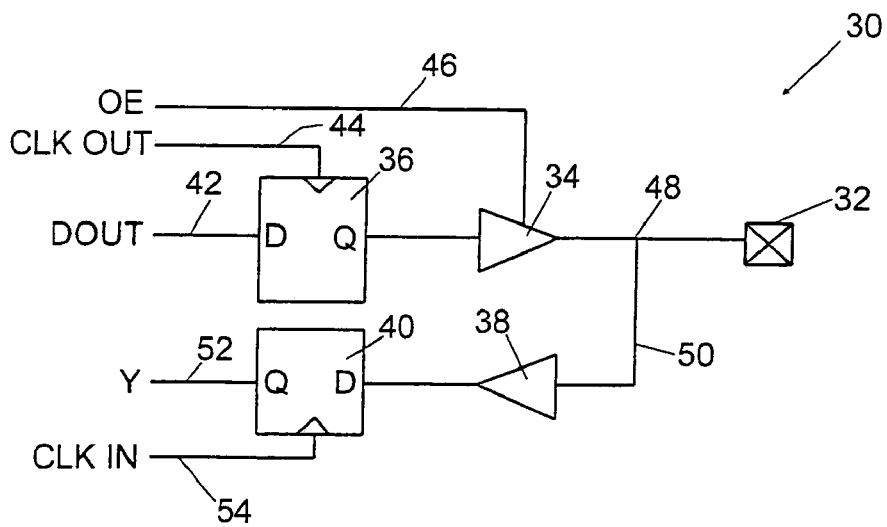
FIG. 2 is a simplified schematic diagram showing an input/output port with increased functionality.
Figure 3:
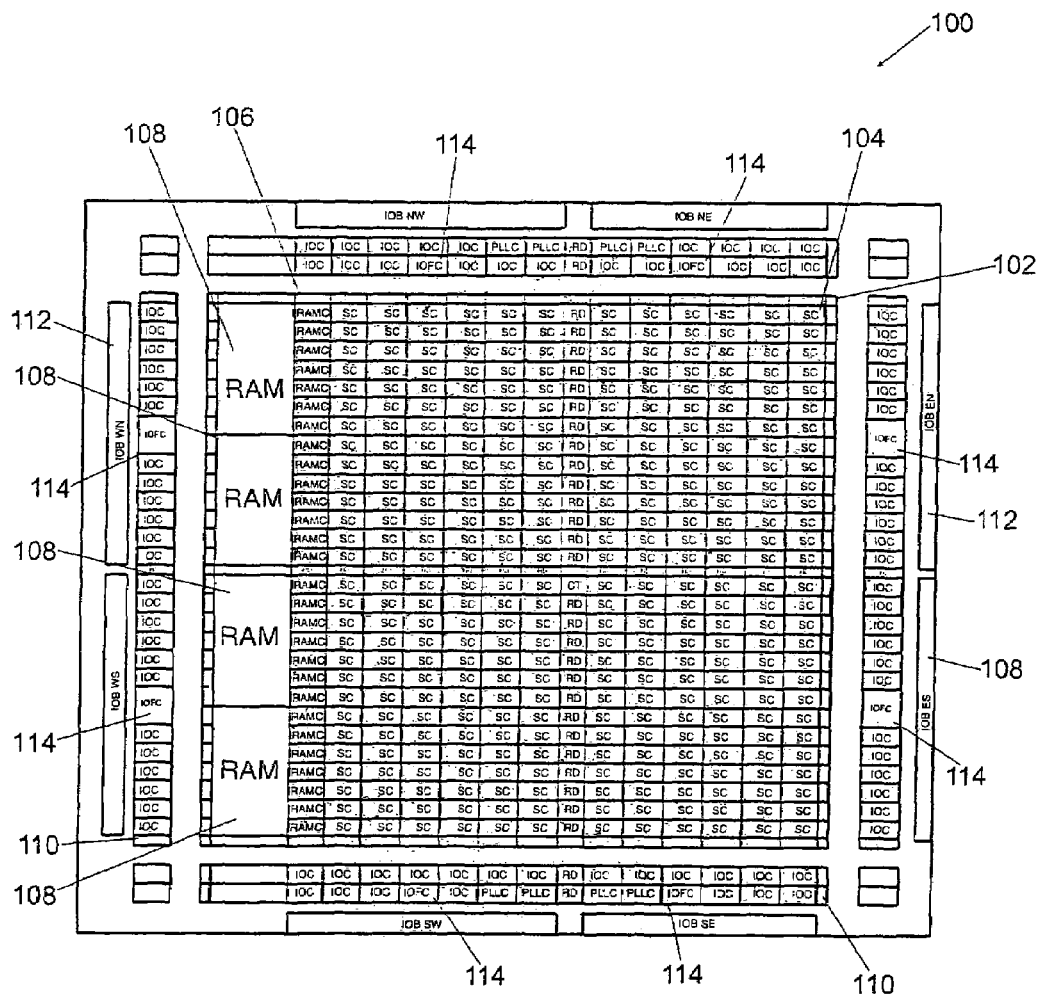
FIG. 3 is a block diagram of a one-tile FPGA of the present system.

FIG. 3 is a block diagram of a core tile 102 in an FPGA 100 of the present system. FPGA core tile 102 comprises an array of logic clusters 104, random access memory clusters 106 and random access memory modules 108. Logic clusters 104 are connected together by a routing interconnect architecture (not shown) that may comprise multiple levels of routing interconnects. FPGA core tile 102 is surrounded by input/output (I/O) clusters 110, input/output (I/O) FIFO control blocks 114 and input/output banks 112. There are two rows of I/O clusters 110 on the north and south edges of FPGA 100 and one column of I/O clusters on the west and east edges of FPGA 100.

Figure 4:
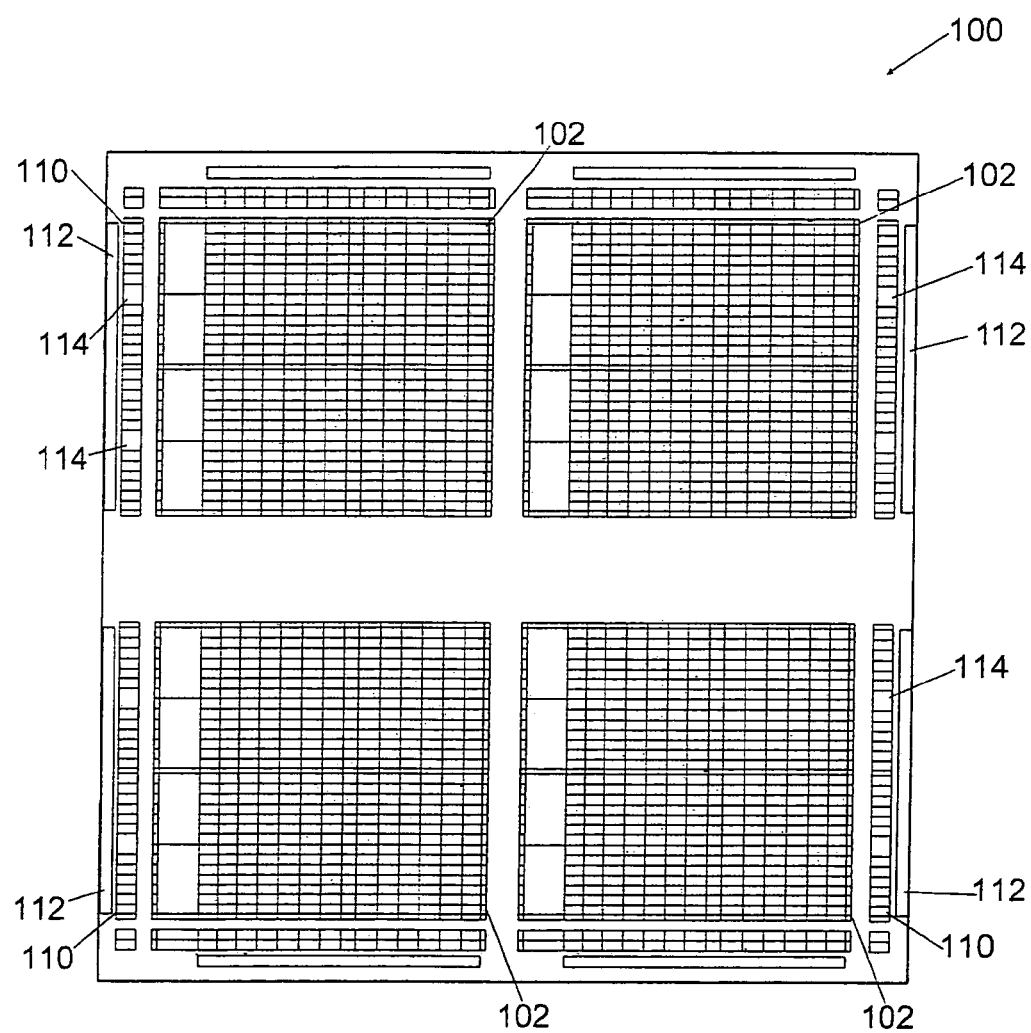
FIG. 4 is a simplified diagram of an FPGA having multiple core tiles.

FIG. 4 is a block diagram of an FPGA including multiple core tiles 102 as shown as an example in FIG. 3. As shown in FIG. 4, FPGA 120 comprises four core tiles 102, though other numbers of tiles are possible. Core tiles 102 are surrounded by I/O clusters 110, input/output FIFO control blocks 114 and I/O banks 112.

Figure 5:
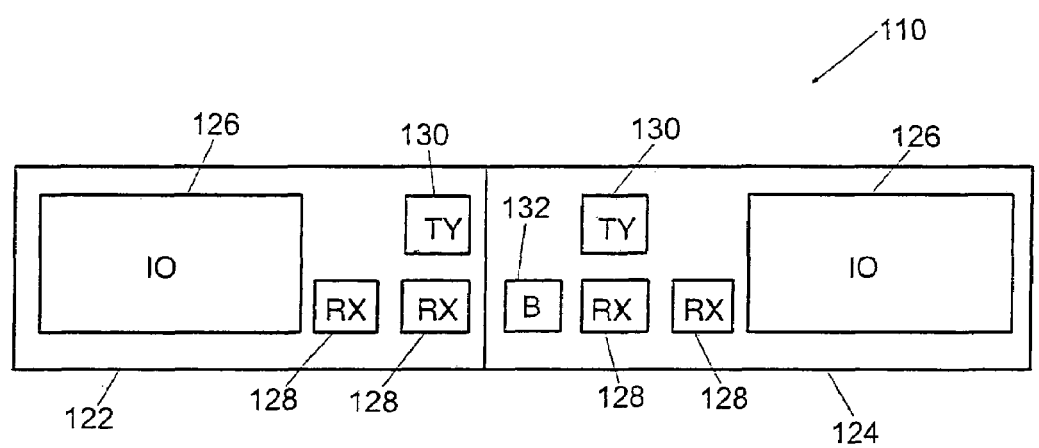
FIG. 5 is a simplified block diagram of an I/O cluster of the present system.

FIG. 5 is a simplified block diagram of a I/O cluster 110 of the present system. As would be clear to those of ordinary skill in art having the benefit of this disclosure, I/O cluster 110 may comprise any number of the logic components indicated below. The example set forth below is for illustrative purposes only and in no way limits the scope of the present invention. I/O cluster 110 comprises two sub-clusters 122 and 124. Sub-clusters 122 and 124 each contain one I/O module 126, two receiver modules (RX) 128, and one transmitter module (TY) 130. Sub-cluster 124 contains a buffer module 132.

To avoid overcomplicating the disclosure and thereby obscuring the present invention, receiver modules 128, transmitter modules 130 and buffer module 132 are not described in detail herein. The implementation of receiver modules 128 and transmitter modules 130 suitable for use according to the present system is disclosed in U.S. patent application Ser. No. 10/323,613, filed on Dec. 18, 2002, and hereby incorporated herein by reference. The implementation of buffer modules suitable for use according to the present system is disclosed in U.S. patent application Ser. No. 10/293,895, filed on Nov. 12, 2002, now issued as U.S. Pat. No. 6,727,726, and hereby incorporated herein by reference.

Figure 6:
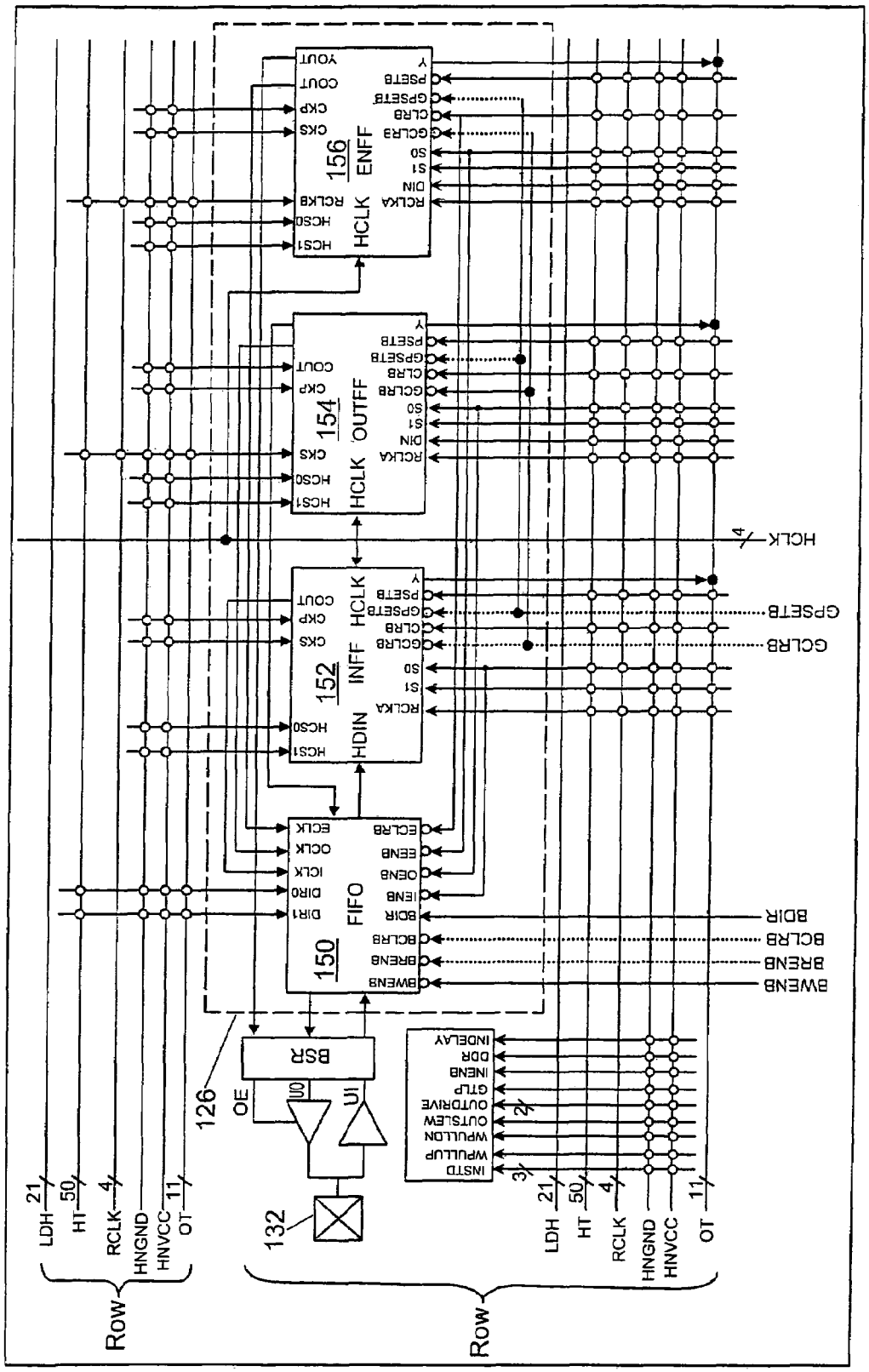
FIG. 6 is a simplified schematic diagram illustrating the I/O module of the present system and the interface of the I/O module with an I/O pad.

FIG. 6 is a simplified schematic diagram illustrating I/O module 126 of the present system and the interface of the I/O module 126 with an I/O pad 132. Each I/O module 126 comprises three dedicated registers 152, 154, 156 and a 64 bit FIFO 150. I/O modules 126 serve two purposes, logic functionality and device protection during programming. The logic functionality depends on the module type. Device protection is needed during programming because the high voltages used to program FPGA 100's routing interconnect architecture would damage the gate oxide of a standard CMOS gate. I/O modules 126 provide isolation of the programming voltage from the CMOS gates. The protection function will be discussed in greater detail below.

Figure 7:
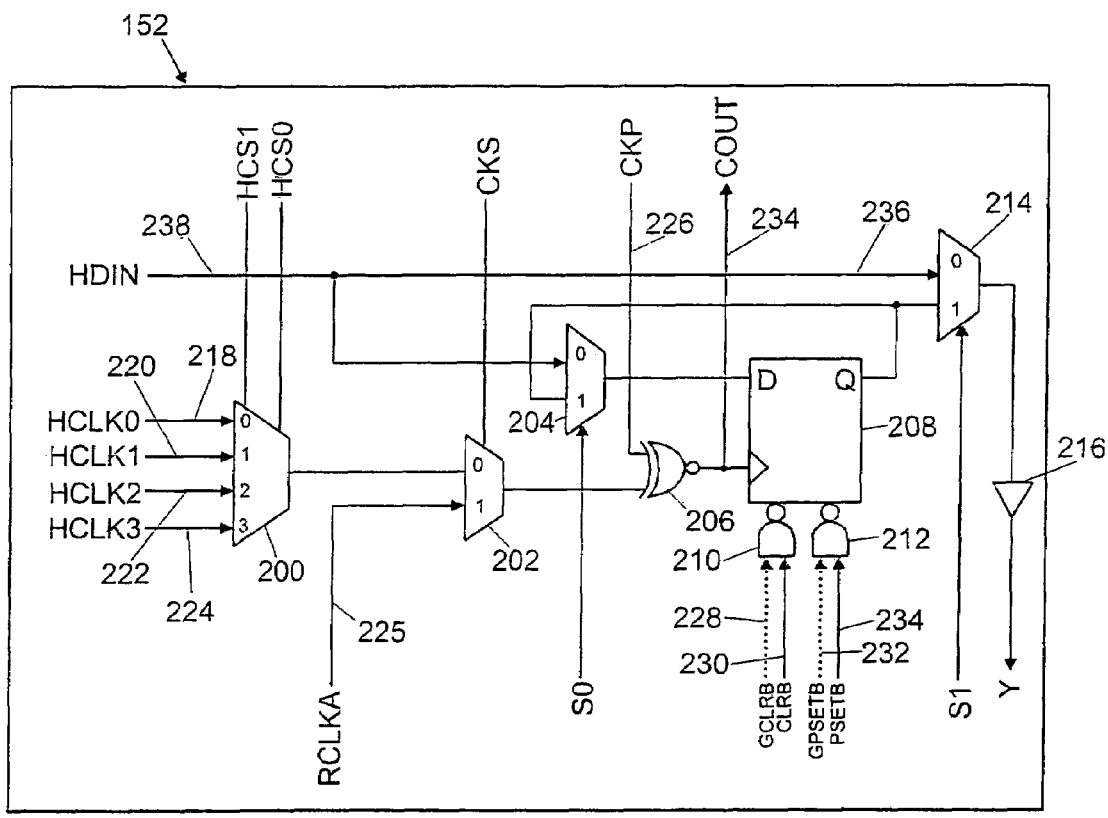
FIG. 7 is a simplified schematic diagram illustrating an input register of the present system.

FIG. 7 is a simplified schematic diagram illustrating an input register of the present system. As shown in FIG. 7, register 152 comprises a four-input multiplexer 200 having its output coupled to one input of a two-input multiplexer 202. Four-input multiplexer 200 selects one input from four clock signal lines 218, 220, 222, 224. Two-input multiplexer 202 has a second input coupled to a clock input signal line 225. Two-input multiplexer 202 has an output coupled to one input of a two-input XNOR gate 206. Two-input XNOR gate 206 has a second input provided from signal line 226. The output of two-input XNOR gate 206 is coupled to the clock input of register 208 and provides a clock signal through signal line 234. Signal line 234 sends the selected clock signal to FIFO 150 (as shown in FIG. 5). A second two-input multiplexer 204 has one input coupled to signal line 238 and a second input that is looped from the output of register 208. Register 208 has a second input coupled to the output of two-input multiplexer 204 and a third and fourth input coupled to signal lines 228, 230, 232, 234 through NAND gates 210 and 212. The output of register 208 is coupled to one input of two-input multiplexer 214. The second input of two-input multiplexer 214 is from signal line 238. The output of two-input multiplexer 214 provides the Y output of register 152 through driver 216. The Y output of register 152 may be sent back into the FPGA core logic.

Figure 8:
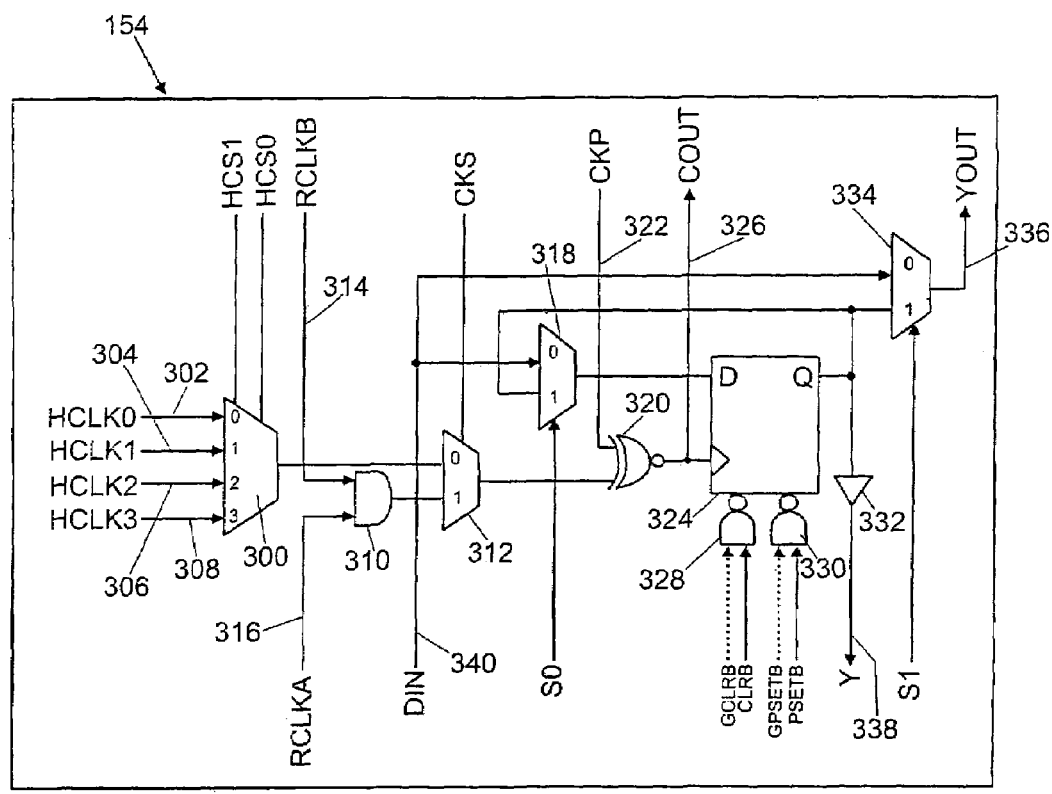
FIG. 8 is a simplified schematic diagram illustrating an output and enable register of the present system.

FIG. 8 is a simplified schematic diagram illustrating an output and enable register of the present system. As shown in FIG. 8, Register 154 comprises a four-input multiplexer 300 having clock input signals 302, 304, 306, 308. Multiplexer 300 has an output coupled to the input of two-input multiplexer 312. Multiplexer 312 has a second input coupled to the output of AND gate 310. AND gate 310 has two inputs from clock signal lines 314, 316. The output of multiplexer 312 is coupled to one input of a two-input XNOR gate 320. The second input of two-input XNOR 320 gate is coupled to signal line 322. The output of two-input XNOR gate is coupled to the clock input of register 324 and to the selected clock signal output signal line 326. Signal line 326 sends the selected clock signal to FIFO 150 (as shown in FIG. 6). Register 324 has a second input coupled to the output of multiplexer 318 and two inputs coupled to the outputs of two-input NAND gates 328 and 330. The output of register 324 provides the Y output signal of the register 154 through signal line 338 and through driver 322. The Y output of register 154 may be sent back into the FPGA core logic. The output of register 324 is also coupled to a first input of two-input multiplexer 334 and may also be fed back into the input of register 324 through two-input multiplexer 318. The second input of two input multiplexer 334 is coupled to signal line 340, which is coupled to the routing architecture (not shown) of the FPGA. The output of multiplexer 334 provides the YOUT signal of register 154 through signal line 336. The YOUT signal is sent to either FIFO 150 or I/O pad 132. Register 156 is identical to register 154.

Figure 9:
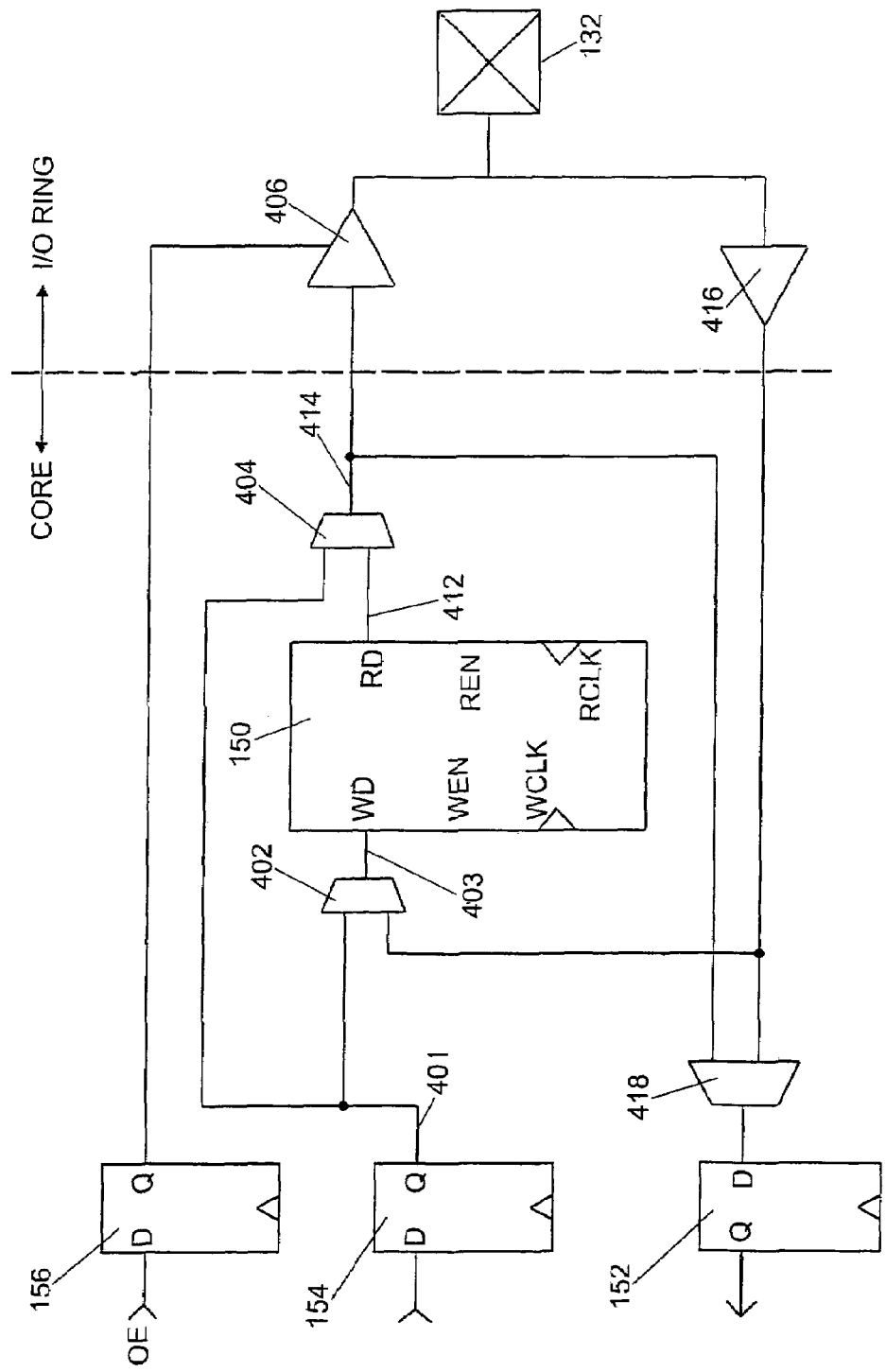
FIG. 9 is a simplified block diagram illustrating FIFO memory 150 as set forth in the present system.

FIG. 9 is another simplified block diagram illustrating FIFO memory 150 as set forth in the present system. For clarity, some of the same reference numerals are used to refer to the same components as used in previous. FIFO memory 150 has a write data input line 403 coupled to the FPGA core (not shown) through a first input of a first two-input multiplexer 402 and output register 154. The second input of first two-input multiplexer 402 is coupled to the output of input buffer 416. FIFO memory 150 has a read data output line 412 coupled to a first input of a second two-input multiplexer 404. Multiplexer 404 has a second input coupled to output signal line 401 of output register 154 and an output coupled to the input of output buffer 406 and to a first input of a third two-input multiplexer 418. Output buffer 406 has a control input coupled to the output of enable register 156 and an output coupled to I/O pad 132. I/O pad 132 is coupled to the input of input buffer 416. Input buffer 416 has an output coupled to a second input of third two-input multiplexer 418 and to a second input of first two-input multiplexer 402. Third two-input multiplexer 418 has an output coupled to data input line of input register 152.

FIFO memory 150 is an 8 word by 8-bit memory array, configured as a 64 by 1 bit memory though other numbers of bits and configurations are possible. FIFO functions are well known to those of ordinary skill in the art and thus the architecture of a FIFO circuit configuration will not be discussed herein to avoid overcomplicating the present disclosure and obscuring the present invention. Two six-bit binary counters are used for generating read and write addresses. The input/output FIFO control blocks 114 (as shown in FIG. 4) provide the FIFO memory 150 with read and write control and standard FIFO flags. Input/output FIFO control blocks 114 will be discussed in greater detail below. The standard FIFO flags are commonly referred to as full, empty, almost full and almost empty flags.

Moreover, FIFO 150 can be used without input/output FIFO control blocks 114 in applications where flags are not needed. In addition, FIFO 150 can be used without input/output FIFO control blocks 114 in applications where different control logic is needed.

FIFO 150 is functionally inserted into either of the input or output data paths. The interface to FIFO 150 is determined by a basic three-register I/O structure. The present system allows for the sharing of control signals between registers 152, 154, 156 and FIFO 150. When FIFO 150 is inserted into a particular data path, the register associated with that data path provides the control signal. For example, if FIFO 150 is programmed to buffer the data coming on to the chip, then register 152 would not be used since the data is buffered through FIFO 150. In this case, the clock select circuitry of register 152 provides the write clock for FIFO 150 via clock output signal line 234 as shown in FIG. 7.

Similarly, if FIFO 150 is programmed to buffer data leaving the chip, register 154 would not be used since the data is buffered through FIFO 150. In this case, the clock select circuitry of register 154 provides the read clock for FIFO 150 via output signal line 326 as is shown in FIG. 8.

Figure 10:
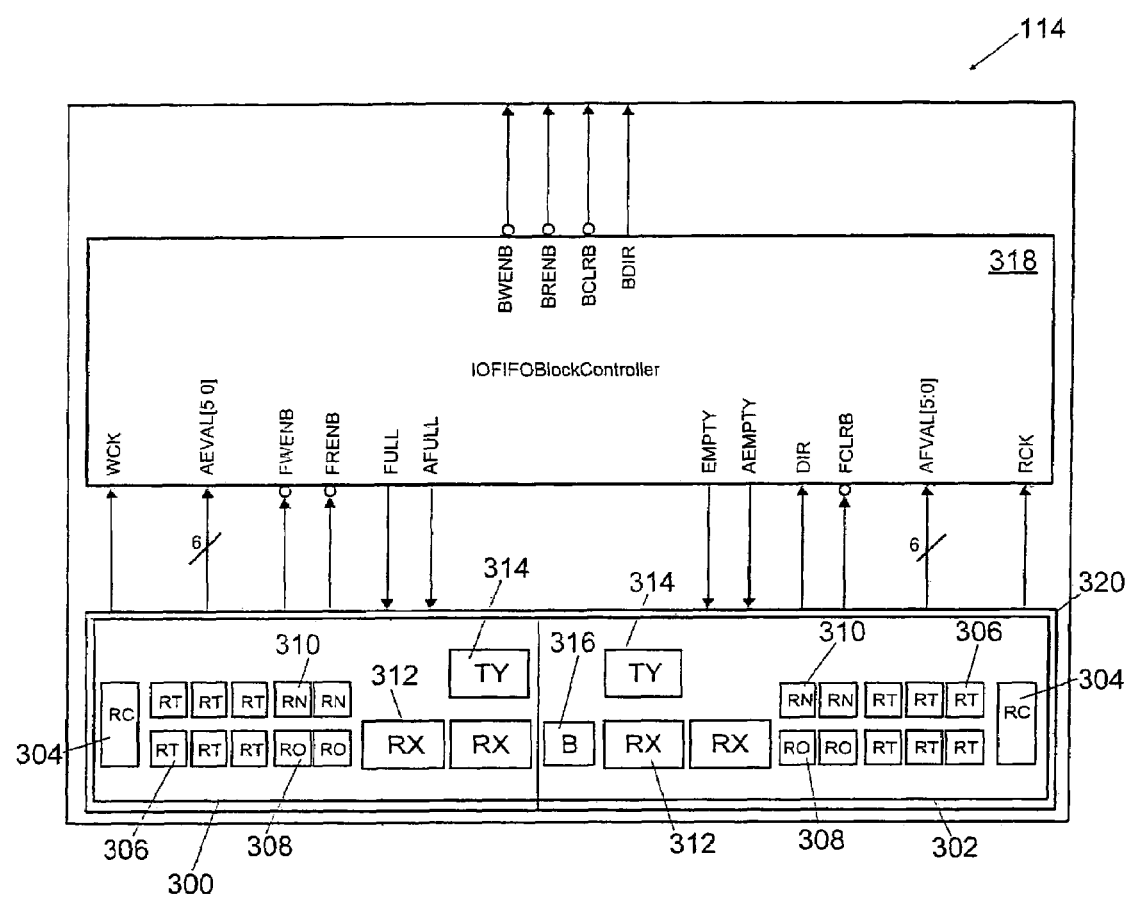
FIG. 10 is a simplified schematic diagram illustrating an input/output (I/O) FIFO control block 114 of the present system.

FIG. 10 is a simplified block diagram illustrating an input/output (I/O) FIFO control block 114 of the present system. There is a plurality of I/O FIFO control block 114 inserted between I/O clusters 110 along the perimeter of FPGA 100. For illustrative purposes only, there are two along each outside edge of each FPGA core tile 102. In the present example, there are eight I/O FIFO control blocks 114 as previously shown in FIG. 3 and sixteen in FIG. 4.

I/O FIFO control block contains a FIFO control block 318, which contains logic components used to generate the full, empty, almost-full and almost-empty flags, and an I/O FIFO control block cluster 320. As is known to those of ordinary skill in the art, various combinations of logic components may be used to generate the flags for a FIFO component. FIFO control block 318 will not be discussed in detail herein in order to avoid overcomplicating the disclosure and thereby obscuring the present invention. Each I/O FIFO control block cluster 320 has two sub clusters 300 and 302. Each sub cluster 300 and 302 has an RC module 304, six RT modules 306, two RN modules 310, two RO modules 308 a transmitter module 314 and two receiver modules 312. Right sub cluster 302 has a buffer module 316. As set forth above receiver module 312, transmitter module 314 and buffer module relate to the routing architecture of FPGA 100 and will not be discussed herein to avoid overcomplicating and thus obscuring the present disclosure.

Figure 11:
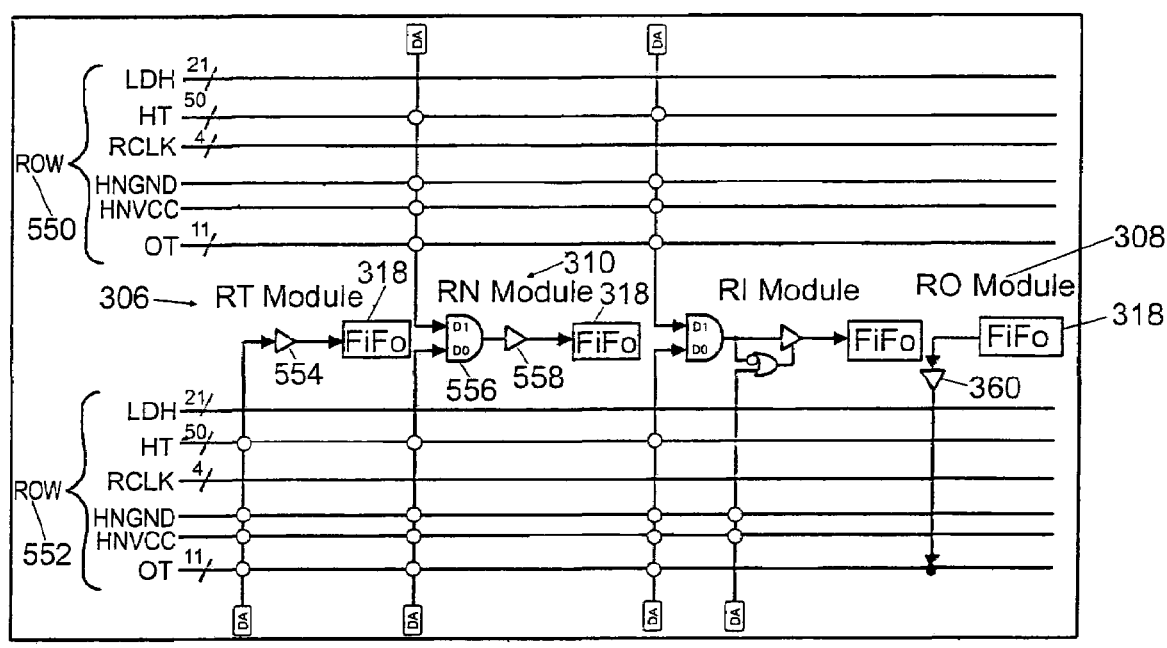
FIG. 11 is a simplified schematic diagram illustrating RT module, RN module and RO module of the input/output FIFO control block of FIG. 10.

FIG. 11 is a simplified schematic diagram illustrating RT module 306, RN module 310 and RO module 308 of an I/O FIFO control block as shown in FIG. 10 of the present system. Similar reference numbers are used to describe similar elements while new reference numbers are used to describe new components. RT module 306 comprises a buffer 554 that has an input programmable coupled to a horizontal routing track in routing architecture row 552. Buffer 554 has an output that is coupled to FIFO control block 318. RN module 310 comprises a two-input AND gate 556. One input of two-input AND gate 556 is programmably coupled to a horizontal routing track in routing architecture row 550. The second input of two-input AND gate 556 is programmably coupled to a horizontal routing track in routing architecture row 552. The output of two-input AND gate 556 is coupled to the input of buffer 358 that has an output that is hardwired to the FIFO control block 318. RO module 308 comprises a buffer 560 having an input hardwired to FIFO control block 318. The output of buffer 560 drives an output track, which is used to connect to the programmable routing architecture.

Figure 12:
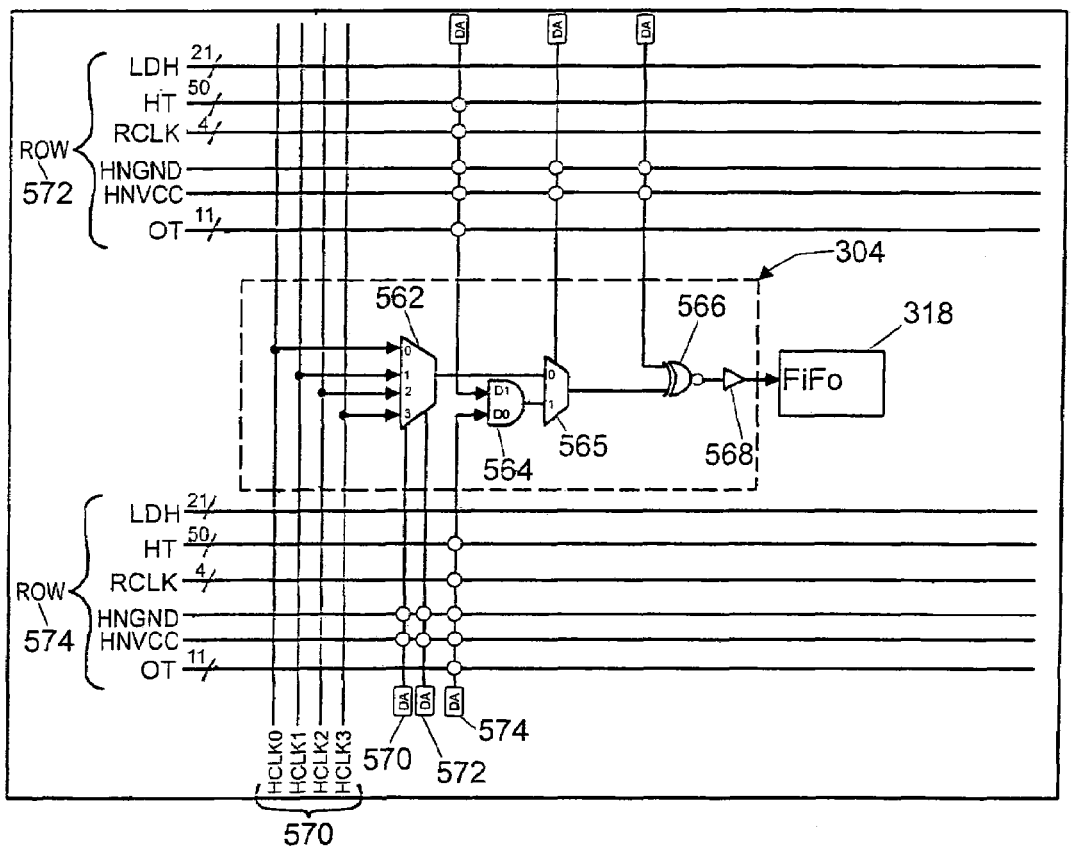
FIG. 12 is a simplified schematic diagram illustrating RC module of the input/output FIFO control block of FIG. 10.

FIG. 12 is a simplified schematic diagram illustrating RC module 304 of I/O FIFO control block 114 as shown in FIG. 10 of the present system. RC module 304 comprises a four input multiplexer 562 having inputs coupled to the clock network bus 570 (not shown). Multiplexer 562 has an output coupled to a first input of a two-input multiplexer 565. The second input of two-input multiplexer 565 is programmably coupled to the routing architecture in rows 572 and 574 through two-input AND gate 564. Two-input multiplexer 565 has an output coupled to an input of a two-input XNOR gate that has a second input programmably coupled to Vcc or ground in routing architecture row 572. The XNOR gate 566 is hardwired to FIFO control block RAM 518 through buffer 568.

The almost-full and almost-empty flags generated by FIFO control block 114 have programmable threshold values. The FIFO control block 114 performs arithmetic operations on the read and write address to determine when the almost-full and almost-empty conditions are present. Arithmetic logic calculates the difference between the six bit write and read addresses. The magnitude of the difference is compared to the almost full and almost empty threshold values.

While embodiments and applications of this system have been shown and described, it would be apparent to those skilled in the art that many more modifications than mentioned above are possible without departing from the inventive concepts herein. The system, therefore, is not to be restricted except in the spirit of the appended claims.

What is claimed is:

1. A field programmable gate array architecture having a plurality of input/output pads comprising:
   a plurality of logic clusters;
   a plurality of input/output clusters;
   a plurality of input/output buffers;
   a plurality of dedicated input/output first-in/first-out memory blocks; and
   a routing interconnect architecture programmably coupling said logic clusters, input/output buffers and said input/output clusters, wherein:
   said dedicated input/output first-in/first-out memory blocks are programmably coupled between said input/output buffers and said input/output clusters.

* * * * *